United States Patent
Ito

(10) Patent No.: US 8,618,516 B2
(45) Date of Patent: Dec. 31, 2013

(54) CHARGED-PARTICLE BEAM EXPOSURE APPARATUS AND METHOD OF MANUFACTURING ARTICLE

(75) Inventor: Hirohito Ito, Funabashi (JP)

(73) Assignee: Canon Kabushiki Kaisha (JP)

( * ) Notice: Subject to any disclaimer, the term of this patent is extended or adjusted under 35 U.S.C. 154(b) by 221 days.

(21) Appl. No.: 13/294,380

(22) Filed: Nov. 11, 2011

(65) Prior Publication Data

US 2012/0126136 A1     May 24, 2012

(30) Foreign Application Priority Data

Nov. 19, 2010   (JP) ................................. 2010-259523

(51) Int. Cl.
    *H01J 37/147*      (2006.01)

(52) U.S. Cl.
     USPC ................ 250/492.22; 250/492.1; 250/492.2; 250/492.3; 250/396 R

(58) Field of Classification Search
     USPC ................................ 250/396 R, 492.1–492.3
     See application file for complete search history.

(56) References Cited

FOREIGN PATENT DOCUMENTS

| JP | 7111945 A | 5/1995 |
|---|---|---|
| JP | 2001196297 A | 7/2001 |

*Primary Examiner* — Michael Maskell
(74) *Attorney, Agent, or Firm* — Rossi, Kimms & McDowell LLP

(57) ABSTRACT

A charged-particle beam exposure apparatus which includes a deflector that deflects a charged-particle beam, and a stage mechanism that drives a substrate, and draws a pattern on the substrate while scanning the charged-particle beam in a main-scanning direction by the deflector and scanning the substrate in a sub-scanning direction by the stage mechanism. The apparatus includes a blanker unit configured to control irradiation and unirradiation of the substrate with the charged-particle beam, and a controller configured to control the deflector to deflect the charged-particle beam in the sub-scanning direction by an amount of driving of the substrate in the sub-scanning direction by the stage mechanism during a period of time from stop of drawing on the substrate until restart thereof when the drawing on the substrate is stopped and then restarted while the substrate is driven in the sub-scanning direction by the stage mechanism.

6 Claims, 8 Drawing Sheets

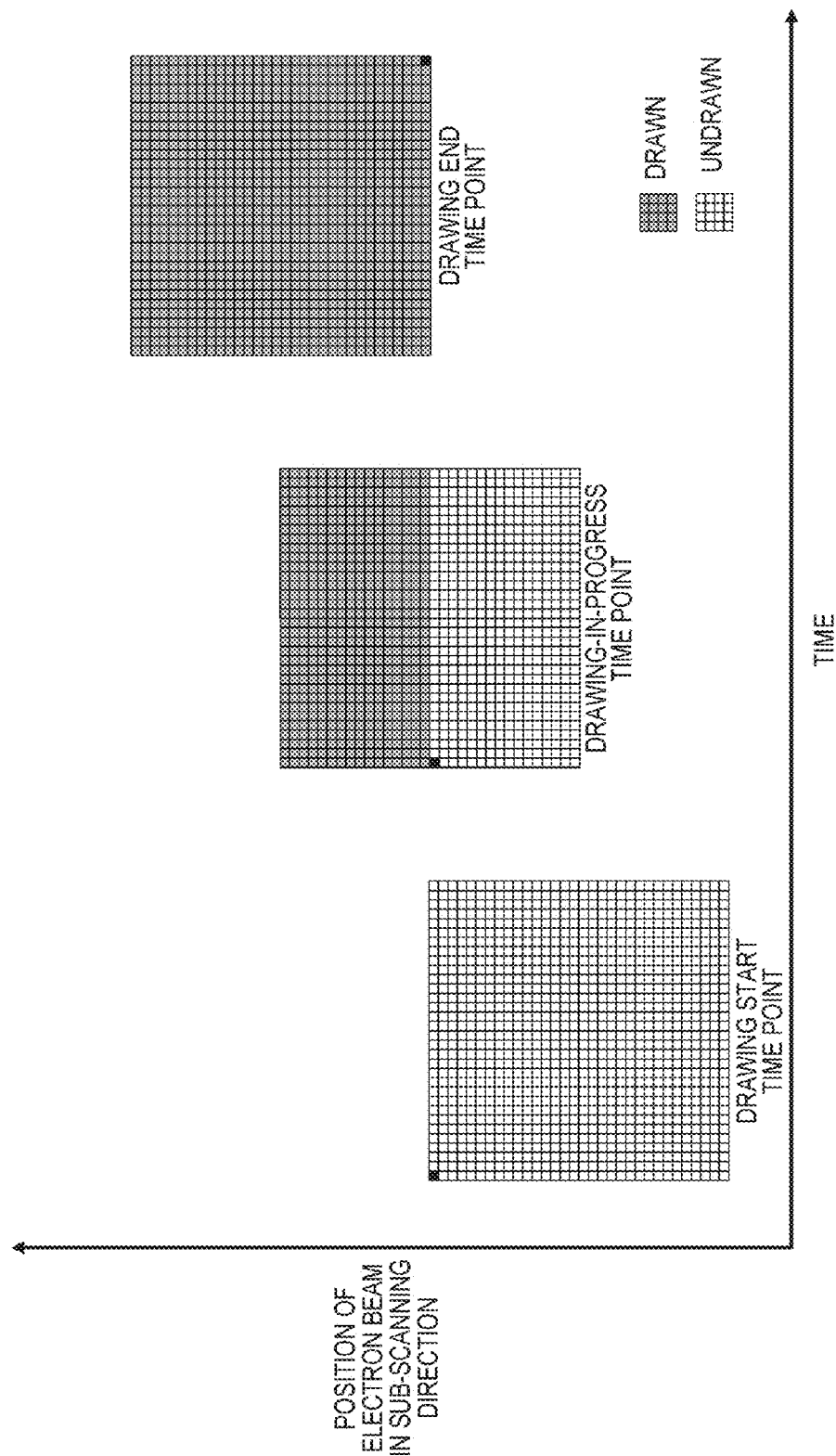

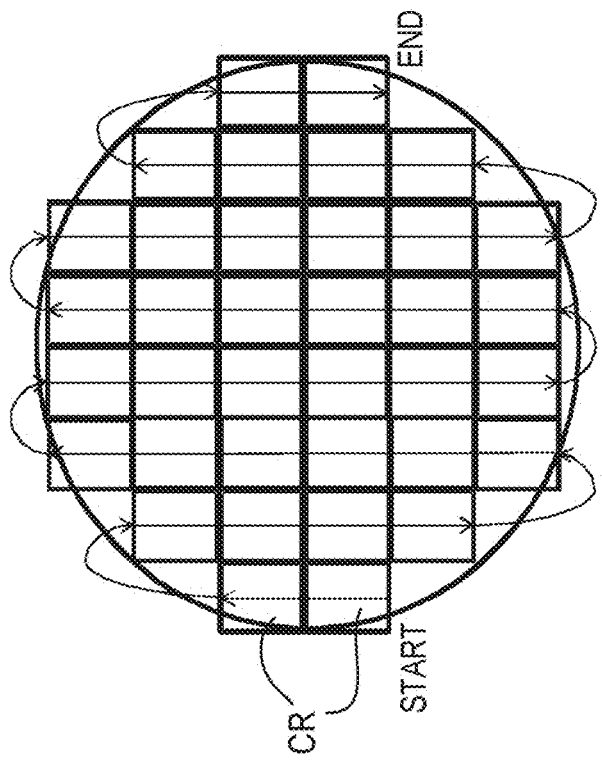
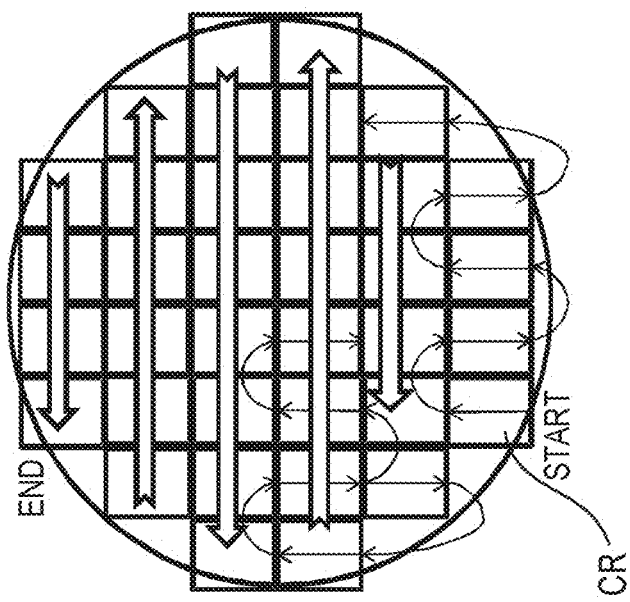

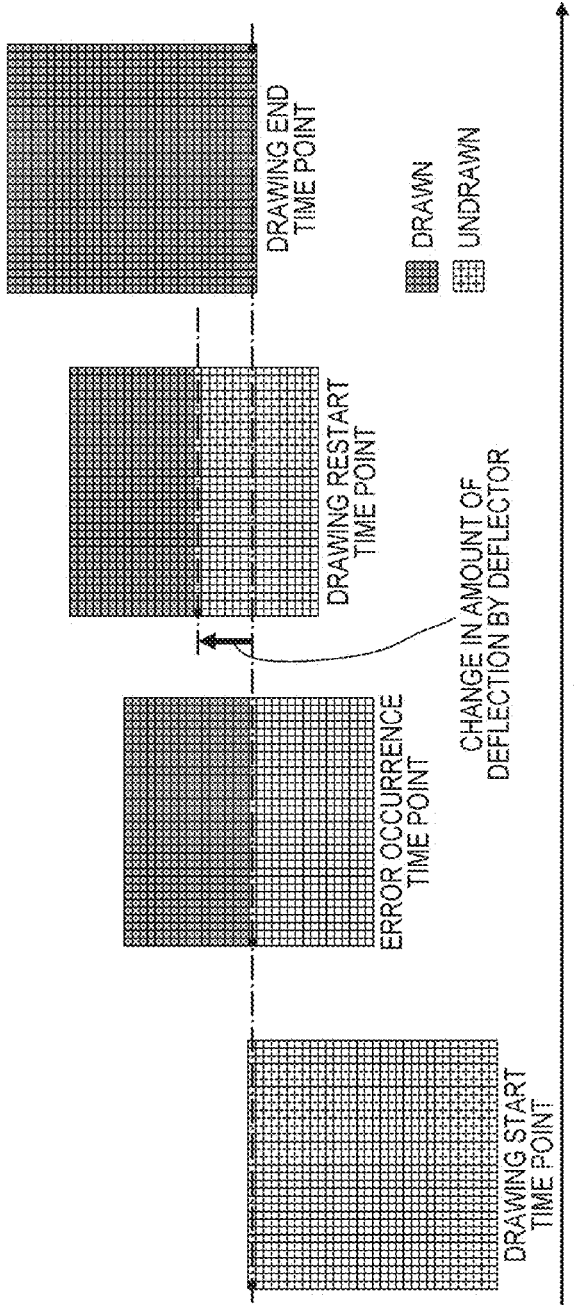

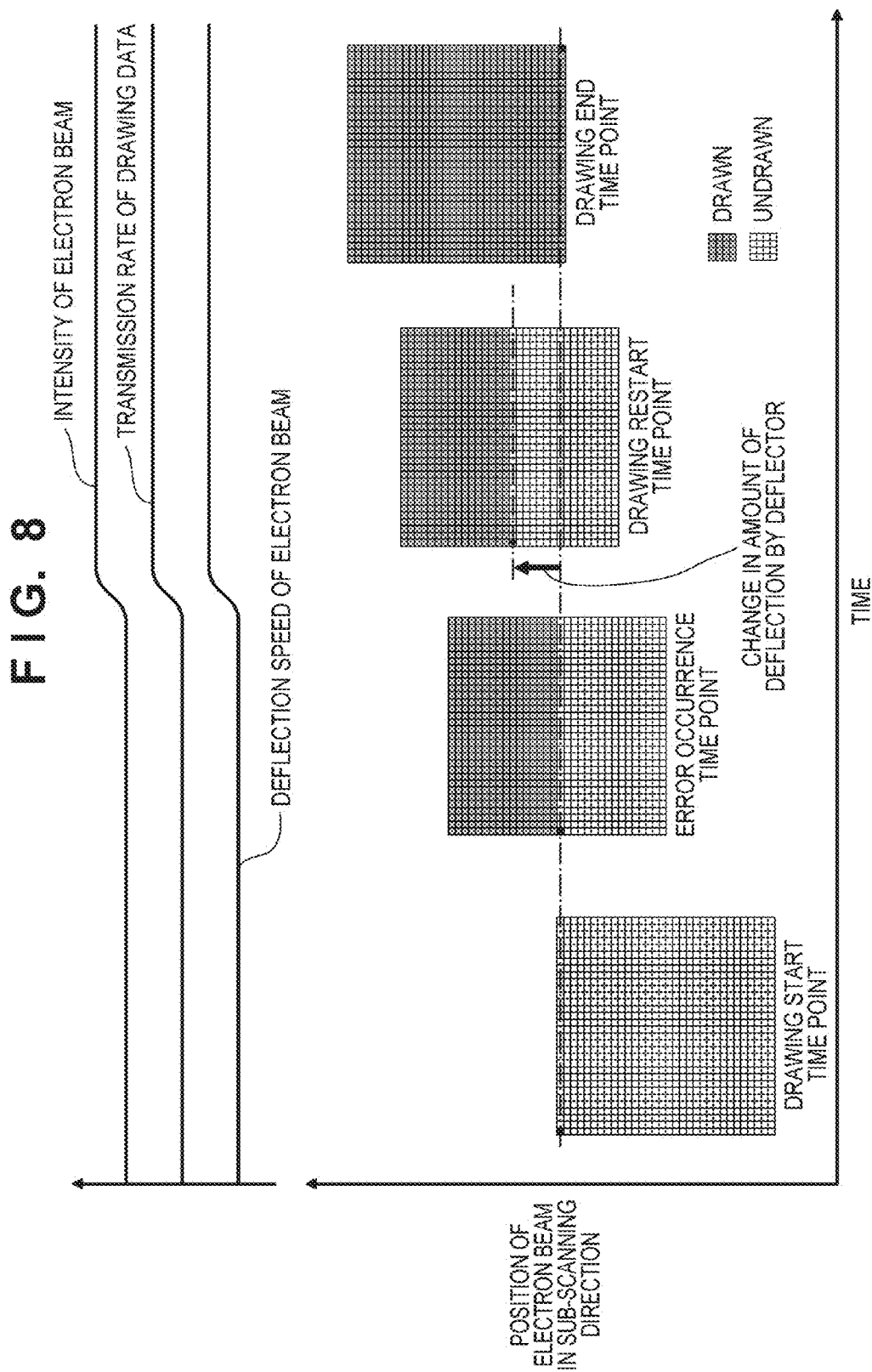

CHARGED-PARTICLE BEAM EXPOSURE APPARATUS AND METHOD OF MANUFACTURING ARTICLE

BACKGROUND OF THE INVENTION

1. Field of the Invention

The present invention relates to a charged-particle beam exposure apparatus which draws a pattern on a substrate by a charged-particle beam, and a method of manufacturing an article using the same.

2. Description of the Related Art

An electron beam exposure apparatus draws a pattern on a substrate, mounted on a stage, by blanking an electron beam, emitted by an electron gun, in accordance with drawing data while scanning the stage in the sub-scanning direction and scanning the electron beam in the main-scanning direction. The blanking is an operation of switching irradiation and unirradiation of the substrate with the electron beam. Controlling the timing of this switching also makes it possible to control the time in which a unit region is irradiated with the electron beam. The drawing data is generated from circuit design CAD data and is bitmap data of a circuit pattern. The drawing data has pixels corresponding to the resolution of a circuit. The drawing data can have a size of about 10 Tbytes per chip at a line width of, for example, 22 or 16 nm.

When the data size is large, an error may occur in the drawing data for various reasons. Examples of conceivable error factors include electrical noise and jitter during data transmission, and an error generated by a memory which stores the data. When an error occurs during transmission, correct data must be retransmitted. In case of the error generated by the memory, drawing data must be read out again or generated again. Due to these error factors, it may become impossible to prepare correct drawing data until a predetermined blanking timing. Also, due to a fluctuation in processing load upon generating drawing data, it may become impossible to prepare data at a predetermined blanking timing.

To prevent the stop of drawing due to delay of drawing data, a method of transmitting and accumulating it in advance in a buffer memory provided near a blanker is available. With this method, even if the drawing data is delayed, drawing can be continued using the data accumulated in the buffer memory, thus preventing degradation in throughput.

Japanese Patent Laid-Open Nos. 2001-196297 and 7-111945 describe electron beam exposure apparatuses which return the position of a stage to that before interruption of drawing, when it restarts drawing.

Unfortunately, the method of providing a buffer memory increases the cost and mounting scale in proportion to the size of the buffer memory. This problem is serious especially in the recent electron beam exposure apparatus because it draws a pattern simultaneously using a large number of electron beams to improve the throughput. Therefore, a buffer memory must be prepared for each electron beam. This means that a considerable number of buffer memories must be prepared for a total number of electron beams although each individual electron beam requires only a small buffer capacity. Since a buffer memory must be provided near the blanker, it is impossible to ensure a given mounting space and, in turn, to mount a buffer memory having the required capacity.

The electron beam exposure apparatuses described in Japanese Patent Laid-Open Nos. 2001-196297 and 7-111945 return the position of the stage to that before interruption of drawing, when it restarts drawing. Therefore, the stage moves to the position before interruption of drawing, and it takes a considerable time for the stage to reach a predetermined scanning speed by reacceleration, thus degrading the throughput.

SUMMARY OF THE INVENTION

The present invention provides a technique advantageous in reducing the capacity of a buffer memory and achieving a high throughput.

One of the aspects of the present invention provides a charged-particle beam exposure apparatus which includes a deflector that deflects a charged-particle beam, and a stage mechanism that drives a substrate, and draws a pattern on the substrate while scanning the charged-particle beam in a main-scanning direction by the deflector and scanning the substrate in a sub-scanning direction by the stage mechanism, the apparatus comprising: a blanker unit configured to control irradiation and unirradiation of the substrate with the charged-particle beam; and a controller configured to control the deflector to deflect the charged-particle beam in the sub-scanning direction by an amount of driving of the substrate in the sub-scanning direction by the stage mechanism during a period of time from stop of drawing on the substrate until restart thereof when the drawing on the substrate is stopped and then restarted while the substrate is driven in the sub-scanning direction by the stage mechanism.

Further features of the present invention will become apparent from the following description of exemplary embodiments with reference to the attached drawings.

BRIEF DESCRIPTION OF THE DRAWINGS

FIG. 3 is a view illustrating the amount of deflection of an electron beam in the sub-scanning direction by a deflector, and the position to which a substrate is driven in the sub-deflection direction by a stage mechanism, when no error occurs;

FIGS. 4A and 4B are views illustrating a procedure of drawing on the substrate;

FIG. 7 is a view illustrating the amount of deflection of an electron beam in the sub-scanning direction by a deflector, and the position to which a substrate is driven in the sub-deflection direction by a stage mechanism, when an error occurs in the second embodiment; and FIG. 8 is a view illustrating the amount of deflection of an electron beam in the sub-scanning direction by a deflector, and the position to which a substrate is driven in the sub-deflection direction by a stage mechanism, when an error occurs in the third embodiment.

DESCRIPTION OF THE EMBODIMENTS

The present invention is applicable to various charged-particle beam exposure apparatuses which draw a pattern on a substrate by a charged-particle beam while scanning the substrate in the sub-scanning direction and scanning the charged-particle beam in the main-scanning direction. The charged-particle beam can be, for example, an electron beam or an ion beam. The charged-particle beam exposure apparatus may be configured to draw a pattern on a substrate using a plurality of charged-particle beams or a single charged-particle beam. To give a more detailed example, the following description assumes that a pattern is drawn on a substrate using a plurality of electron beams. However, the concept to be explained hereinafter is limited neither by the type nor number of charged-particle beams.

Figure 1:
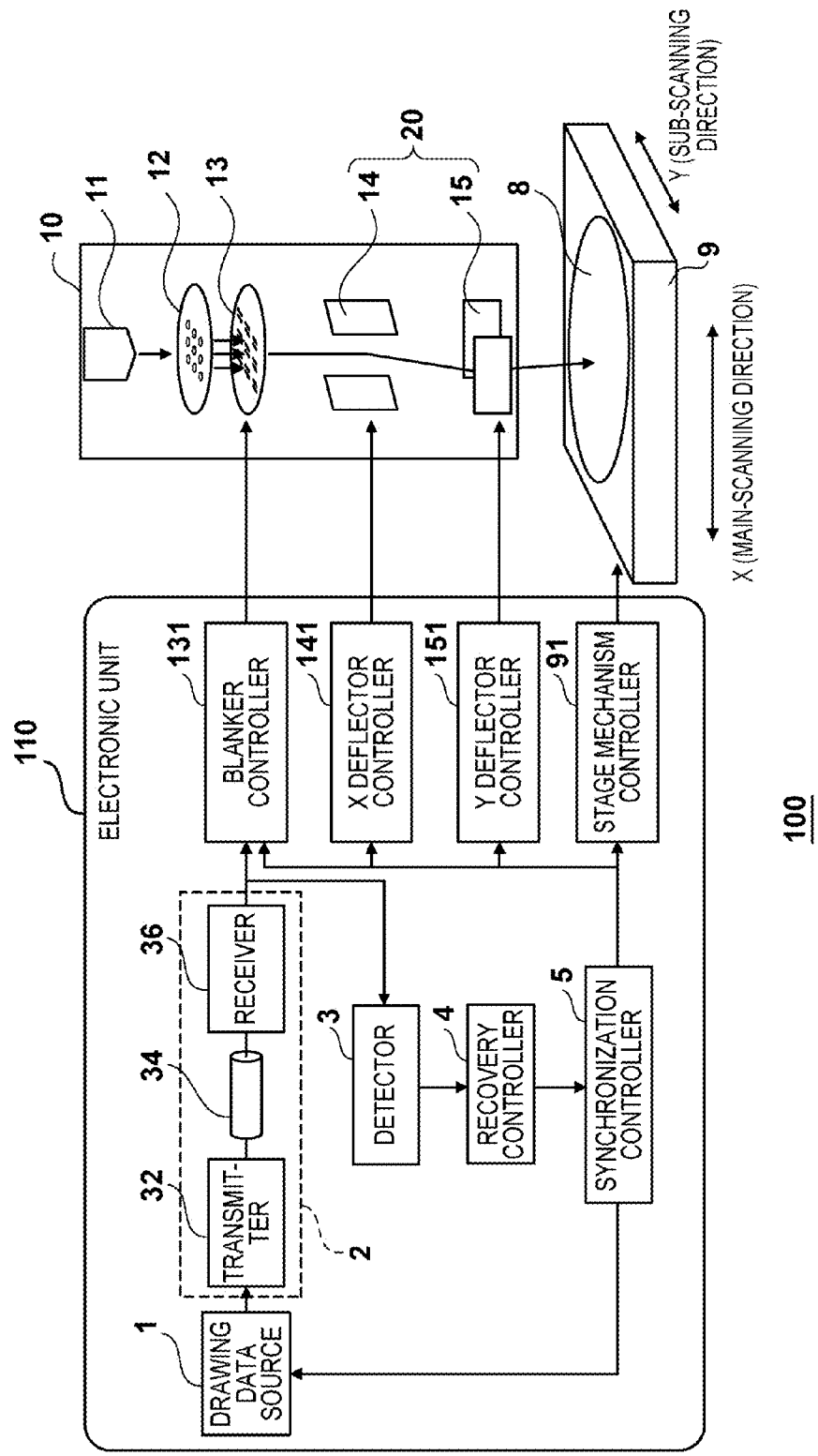
FIG. 1 is a block diagram showing the configuration of a charged-particle beam exposure apparatus according to an embodiment.

An electron beam exposure apparatus 100 that exemplifies the configuration of a charged-particle beam exposure apparatus according to the present invention will be described with reference to FIG. 1. The electron beam exposure apparatus 100 can include a stage mechanism 9 which drives a substrate 8, an electron optical system 10 which irradiates the substrate 8 with an electron beam, and an electronic unit 110 which controls the stage mechanism 9 and electron optical system 10. The electron optical system 10 can include an electron gun (charged-particle source) 11, aperture array 12, blanker unit 13, deflector 20, and imaging system (not shown). An electron beam emitted by the electron gun 11 can be divided into a plurality of electron beams by the aperture array 12. The plurality of electron beams formed by the aperture array 12 individually undergo control of irradiation (ON) and unirradiation (OFF) of the substrate 8 by the blanker unit 13. Although the blanker unit 13 has a plurality of blankers in the example shown in FIG. 1, it typically has a single blanker when the charged-particle beam exposure apparatus is configured to draw a pattern on a substrate by a single electron beam or charged-particle beam. The deflector 20 deflects a plurality of charged-particle beams at once. The deflector 20 includes an X deflector 14 which deflects a charged-particle beam in the X-axis direction (main-scanning direction), and a Y deflector 15 which deflects it in the Y-axis direction (sub-scanning direction). The imaging system forms images of the plurality of electron beams on the surface of the substrate 8.

The stage mechanism 9 can also be called, for example, a substrate stage mechanism. The stage mechanism 9 can include, for example, a substrate chuck which holds the substrate 8, a stage which holds the substrate chuck, and an actuator which drives the stage. The stage mechanism 9 has a function of driving the substrate 8 in at least the Y-axis direction (sub-scanning direction). The stage mechanism 9 typically has a function of driving the substrate 8 in a total of six axial directions: the X-axis direction (main-scanning direction), the Y-axis direction (sub-scanning direction), the Z-axis direction (the axial direction of the electron optical system 10), and rotation directions about the X-, Y-, and Z-axes.

The electronic unit 110 can include a blanker controller 131 which controls the blanker unit 13, an X deflector controller 141 which controls the X deflector 14, a Y deflector controller 151 which controls the Y deflector 15, and a stage mechanism controller 91 which controls the stage mechanism 9. The electronic unit 110 can also include a synchronization controller 5 which synchronously controls the blanker unit 13, X deflector 14, Y deflector 15, and stage mechanism 9 so that the electron beam is guided to a target position on the substrate 8. Note that the synchronization controller 5 controls the blanker unit 13, X deflector 14, Y deflector 15, and stage mechanism 9 via the blanker controller 131, X deflector controller 141, Y deflector controller 151, and stage mechanism controller 91, respectively.

The electronic unit 110 also includes an interface 2 which transmits drawing data. The interface 2 can include a transmitter 32, transmission line 34, and receiver 36. The blanker controller 131 controls the plurality of blankers of the blanker unit 13 so that irradiation and unirradiation of the substrate 8 with the plurality of electron beams are individually controlled in accordance with the drawing data received by the receiver 36. The electronic unit 110 can also include a detector 3 and recovery controller (controller) 4. The detector 3 detects the occurrence of an underrun error that hampers supply of correct drawing data to the blanker controller 131 while a pattern is drawn on the substrate 8. The recovery controller 4 controls the blanker controller 131 to stop drawing as the occurrence of an underrun error is detected by the detector 3. The recovery controller 4 then controls the blanker controller 131 to restart drawing after correct drawing data becomes ready to be supplied to the blanker controller 131. While the substrate 8 is driven in the sub-scanning direction by the stage mechanism 9, the recovery controller 4 executes the following control when it restarts drawing on the substrate 8 after the stop of drawing. In other words, the recovery controller 4 controls the Y deflector 15 to deflect the charged-particle beam in the sub-scanning direction by the amount of driving of the substrate 8 in the sub-scanning direction by the stage mechanism 9 during the period of time from the stop of drawing to until its restart.

The electronic unit 110 can include a drawing data source 1 which transmits drawing data to the blanker controller 131 via the interface 2. The drawing data source 1 can generate drawing data to control the blanker unit 13, based on, for example, layout design data created by circuit design CAD. This drawing data is bitmap data conforming to the pattern of a semiconductor circuit.

The drawing data source 1 may generate drawing data based on layout design data every time the drawing data is requested, or generate drawing data based on layout design data before the drawing data is requested, and store it in a memory. In the former scheme, the computation load required to generate drawing data is relatively large, and the amount of computation considerably varies between complex and simple portions of the design data. Therefore, drawing data corresponding to the complex portion of the layout design data may not be generated before the blanker unit 13 performs blanking. On the other hand, in the latter scheme in which drawing data is stored in a memory, the processing load can be reduced, and the load does not fluctuate in each individual design data, thus allowing a stable operation. However, this scheme requires a mass memory for holding bitmap drawing data, and therefore may increase the frequency of occurrence of a memory readout error.

It is necessary to minimize the probability of occurrence of an error until the blanker unit 13 is controlled as the drawing data source 1 transmits drawing data. Hence, the drawing data source 1 needs to be placed as close to the blanker controller 131 as possible. However, the drawing data source 1 can include, for example, a mass memory for processing a large amount of data, and a parallel processing computer for performing a high-speed arithmetic operation, thus requiring a large mounting space. This makes it difficult to provide the drawing data source 1 near the electron optical system 10. Therefore, drawing data is transmitted to the blanker controller 131 via the interface 2 from the drawing data source 1 placed at a position spaced apart from the electron optical system 10 so that a given mounting space can be ensured. Note that the transmission line 34 in the interface 2 can be, for example, an optical fiber.

Figure 2:
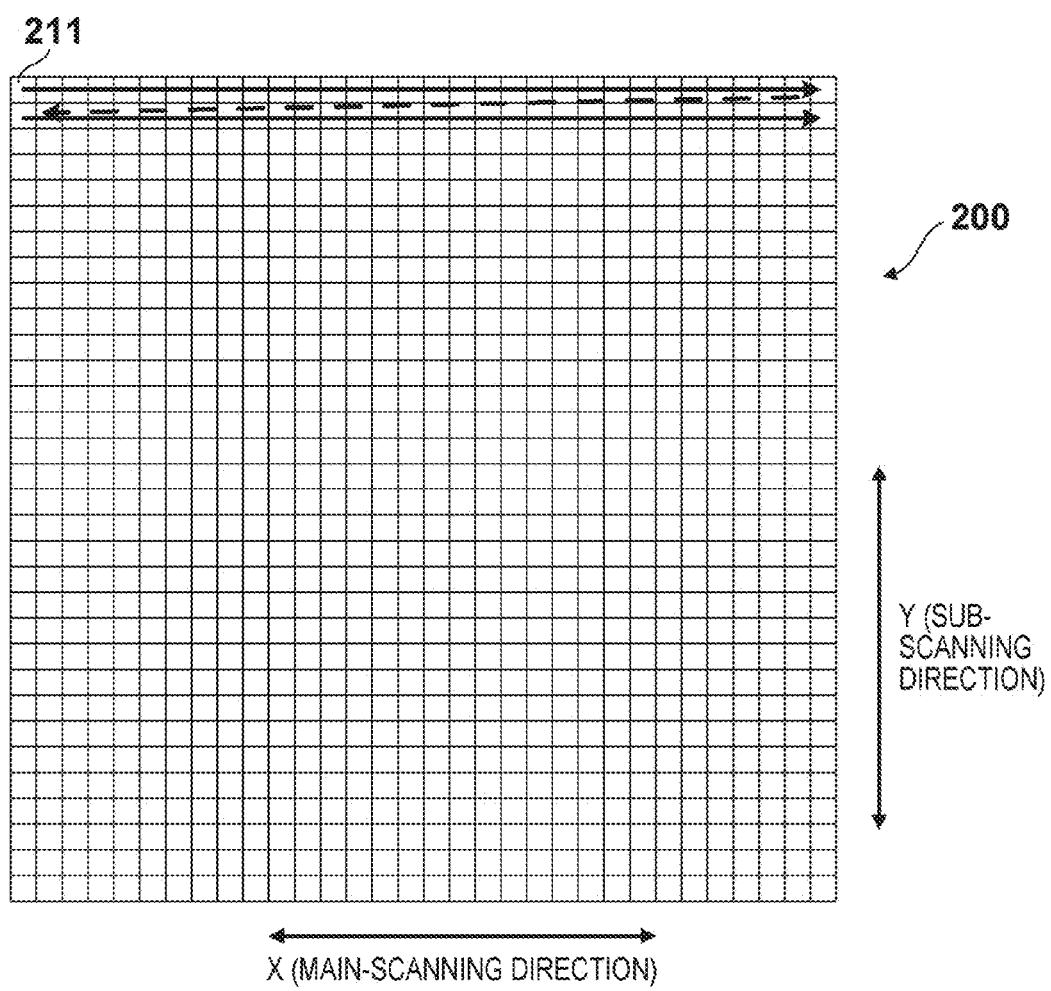
FIG. 2 is a view for explaining an exemplary procedure of drawing a pattern on a substrate.

An exemplary procedure of drawing a pattern on the substrate 8 will be described with reference to FIG. 2. FIG. 2 shows a region 200 drawn by one of the plurality of electron beams. A region adjacent to the region 200 is drawn by an adjacent electron beam. A drawing procedure will be described below by focusing attention on one electron beam. The region 200 is formed by micro regions 211 on pluralities of rows and columns, and one micro region 211 corresponds to one dot (minimum unit of drawing). When n electron beams are used, a pattern is drawn parallel to a partial region formed by n regions 200. In this specification, for the sake of simplicity, the following description assumes that the partial region formed by the n regions 200 is equal to one chip region.

First, the X deflector 14, Y deflector 15, and stage mechanism 9 are controlled so that the upper left micro region 211 of the region 200 is irradiated with the electron beam. If the pattern to be drawn has a line width of 22 nm, the length of each side of the micro region 211 can be set to, for example, a half of this line width, that is, 11 nm. If the pattern to be drawn has a line width of 16 nm, the length of each side of the micro region 211 can be set to, for example, a half of this line width, that is, 8 nm. While the micro region 211 is irradiated with the electron beam, a corresponding blanker in the blanker unit 13 is driven to irradiate the micro region 211 with the electron beam for an irradiation time specified in the drawing data. Subsequently, the electron beam is scanned rightward along the main-scanning direction (X-axis direction) by the X deflector 14, thereby sequentially shifting it to adjacent micro regions 211 (solid arrow) and drawing a pattern for every shift. When drawing in the micro regions 211 on one row is complete, the X deflector 14 is controlled so that the electron beam is guided to the leftmost micro region 211 on the next row (broken arrow). Since the stage mechanism 9 moves the substrate 8 at a constant speed in the sub-scanning direction (Y-axis direction), the Y deflector 15 linearly increases the amount of deflection in the sub-scanning direction to follow the movement of the substrate 8, and returns this amount of deflection to the initial amount of deflection to draw a pattern on the next row after completion of drawing on one row. By repeating this process, a pattern is drawn in the entire region 200. A pattern is then drawn in an adjacent partial region (a chip region in this case) in accordance with the same procedure. Although a pattern is drawn while scanning the electron beam in the same direction on all rows in FIG. 2, the scanning direction may be reversed between odd and even rows.

FIG. 3 illustrates the amount of deflection by the Y deflector (sub-deflector) 15 when drawing data can normally be received by the receiver 36. The stage mechanism 9 drives the substrate 8 at a constant speed in the sub-scanning direction from the start of drawing in chip regions to its end. The maximum value of the amount of deflection by the Y deflector (sub-deflector) 15 is equal to the distance by which the substrate 8 moves in the sub-scanning direction during main-scanning on one row.

FIGS. 4A and 4B illustrate a procedure of drawing in a plurality of chip regions CR within the plane of the substrate 8. In an example shown in FIG. 4A, a pattern is continuously drawn in the chip regions CR aligned on one column in the sub-scanning direction (Y-axis direction), and is then continuously drawn in the chip regions CR aligned on an adjacent column upon a shift to this column. This process is repeated to draw a pattern on the entire surface of the substrate 8. In an example shown in FIG. 4B, a pattern is drawn in the chip regions CR on one row in accordance with a procedure of drawing of a pattern in one chip region CR on one column and drawing a pattern in the next chip region CR on an adjacent column. A pattern is then drawn on the next row in accordance with the same procedure. This process is repeated to draw a pattern on the entire surface of the substrate 8.

An exemplary operation procedure when the occurrence of an underrun error is detected by the detector 3 will be described below with reference to FIG. 5. In step S1, the occurrence of an underrun error is detected by the detector 3, and the recovery controller 4 is notified of this error. This notification will be referred to as error notification hereinafter. At this time, the drawing data source 1 can add an error detection code to drawing data, and transmit them to the receiver 36. The detector 3 can detect that an error has occurred during transmission of drawing data by, for example, collating the received drawing data and the error detection code. This error will be referred to as a transmission error hereinafter. When a transmission error occurs, correct drawing data must be retransmitted from the drawing data source 1 to the blanker controller 131 via the interface 2, and an underrun error may occur in this process. Hence, upon detecting a transmission error, the detector 3 can determine that the state in which correct data cannot be supplied to the blanker controller 131, that is, an underrun error, has occurred. Although a CRC, for example, is commonly used as the error detection code, other codes such as a Hamming code may be used. Alternatively, when transmission of drawing data from the drawing data source 1 is delayed, the detector 3 can determine that an underrun error has occurred.

In notifying the recovery controller 4 that the occurrence of an underrun error has been detected, the detector 3 may notify the recovery controller 4 of information for identifying the portion in a series of drawing data, where an underrun error has occurred, and/or information indicating an error factor. If it is determined that the drawing data source 1 has an underrun error factor, for example, if the receiver 36 has not received necessary drawing data although a transmission error has not occurred, the detector 3 may notify the drawing data source 1 to that effect. Also, the drawing data source 1 may directly notify the detector 3 or recovery controller 4 to that effect.

Upon receiving the error notification, the recovery controller 4 controls the blanker controller 131 to stop drawing in step S2. The recovery controller 4 can control the blanker controller 131 to stop drawing via, for example, the synchronization controller 5 which synchronously controls the blanker unit 13, X deflector 14, Y deflector 15, and stage mechanism 9. Alternatively, if a problem resulting from delay of a series of notifications up to the synchronization controller 5 is posed, the recovery controller 4 or detector 3 may directly control the blanker controller 131 to stop drawing. The blanker controller 131 can stop drawing by controlling the blanker unit 13 so that the electron beam assumes an unirradiation state. This makes it possible to prevent erroneous drawing.

In step S3, the recovery controller 4 determines the drawing restart time by adding the standby time, required to restart drawing after correct drawing data is prepared, to the current time. This standby time can include, for example, (1) the time from detection of the occurrence of an underrun error until error notification, (2) the time taken to instruct the drawing data source 1 to retransmit drawing data after the recovery controller 4 receives the error notification, (3) the time taken for the drawing data source 1 to prepare drawing data again, (4) the time taken for the drawing data source 1 to retransmit the drawing data, and (5) a margin.

The standby time may be determined every time an underrun error occurs, or use a value determined in advance. In this case, the standby time may be determined based on the information indicating an error factor mentioned earlier.

In step S4, the recovery controller 4 instructs the drawing data source 1 to prepare again drawing data in the portion where an underrun error has occurred, and to retransmit the drawing data in accordance with the drawing restart time. Upon receiving the instruction, the drawing data source 1 prepares drawing data in the portion where an underrun error has occurred, and subsequent drawing data. In this case, if, for example, an error (transmission error) has occurred during transmission of the drawing data via the interface 2, and the drawing data remains in the transmission buffer of the transmitter 32, this drawing data can be used. If, for example, an error occurs when the drawing data source 1 reads out the layout design data from the memory, the drawing data source 1 reads it out from the memory again to generate drawing data again. If an underrun error results from, for example, delay of generation of drawing data by the drawing data source 1, the drawing data source 1 continues to generate it.

The drawing data source 1 retransmits drawing data so that the blanker controller 131 can use drawing data at the drawing restart time, based on, for example, the time taken to prepare the drawing data, and the time taken to transmit it via the interface 2.

In step S5, the recovery controller 4 calculates the amount of driving of the substrate 8 by the stage mechanism 9 until the drawing restart time. Note that the stage mechanism 9 drives the substrate 8 at a constant speed even during the stop of drawing. Therefore, the recovery controller 4 can determine the position of the substrate 8 at the drawing restart time based on the period of time from the time at which drawing is stopped by the blanker unit 13 until the drawing restart time, and the position of the substrate 8 at the time at which drawing is stopped.

In step S6, the recovery controller 4 changes the scanning end position of the substrate 8 in the sub-scanning direction by the stage mechanism 9 by the amount of driving of the substrate 8 in the sub-scanning direction by the stage mechanism 9 during the period of time from the stop of drawing until its restart. This is done to prevent the end of scanning of the substrate 8 before completion of drawing. The scanning end position can be changed by sending the scanning end position to the stage mechanism controller 91 by the recovery controller 4.

In step S7, at the time of restart of drawing on the substrate 8 after its stop, the recovery controller 4 instructs the Y deflector controller 151 to deflect the electron beam in the sub-scanning direction by the amount of driving of the substrate 8 in the sub-scanning direction by the stage mechanism 9 during the period of time from the stop of drawing until its restart. Thus, at the drawing restart time, the position, in the sub-scanning direction, of the substrate 8 driven by the stage mechanism 9, and the position of the electron beam in the sub-scanning direction, can be matched with each other. This makes it possible to restart drawing from an appropriate position on the substrate 8.

In step S8, the recovery controller 4 instructs the blanker controller 131, Y deflector controller 151, and X deflector controller 141 to restart drawing at the drawing restart time. The blanker controller 131 controls the blanker unit 13 to restart drawing at the drawing restart time in accordance with the retransmitted drawing data. The Y deflector controller 151 controls the Y deflector 15 to restart following the substrate 8 driven by the stage mechanism 9 from the corrected position in the sub-scanning direction. The X deflector controller 141 controls the X deflector 14 to restart a main-deflection operation at the drawing restart time. The position in the main-scanning direction at the time of restart of drawing corresponds to the retransmitted drawing data. Note that the stage mechanism controller 91 does not change its operation state because it moves the substrate 8 at a constant speed in the sub-scanning direction. In step S9, drawing restarts at the drawing restart time.

The recovery controller 4 may control the drawing data source 1, blanker controller 131, X deflector controller 141, Y deflector controller 151, and stage mechanism controller 91 via the synchronization controller 5, as described above, or control them directly.

Figure 6:
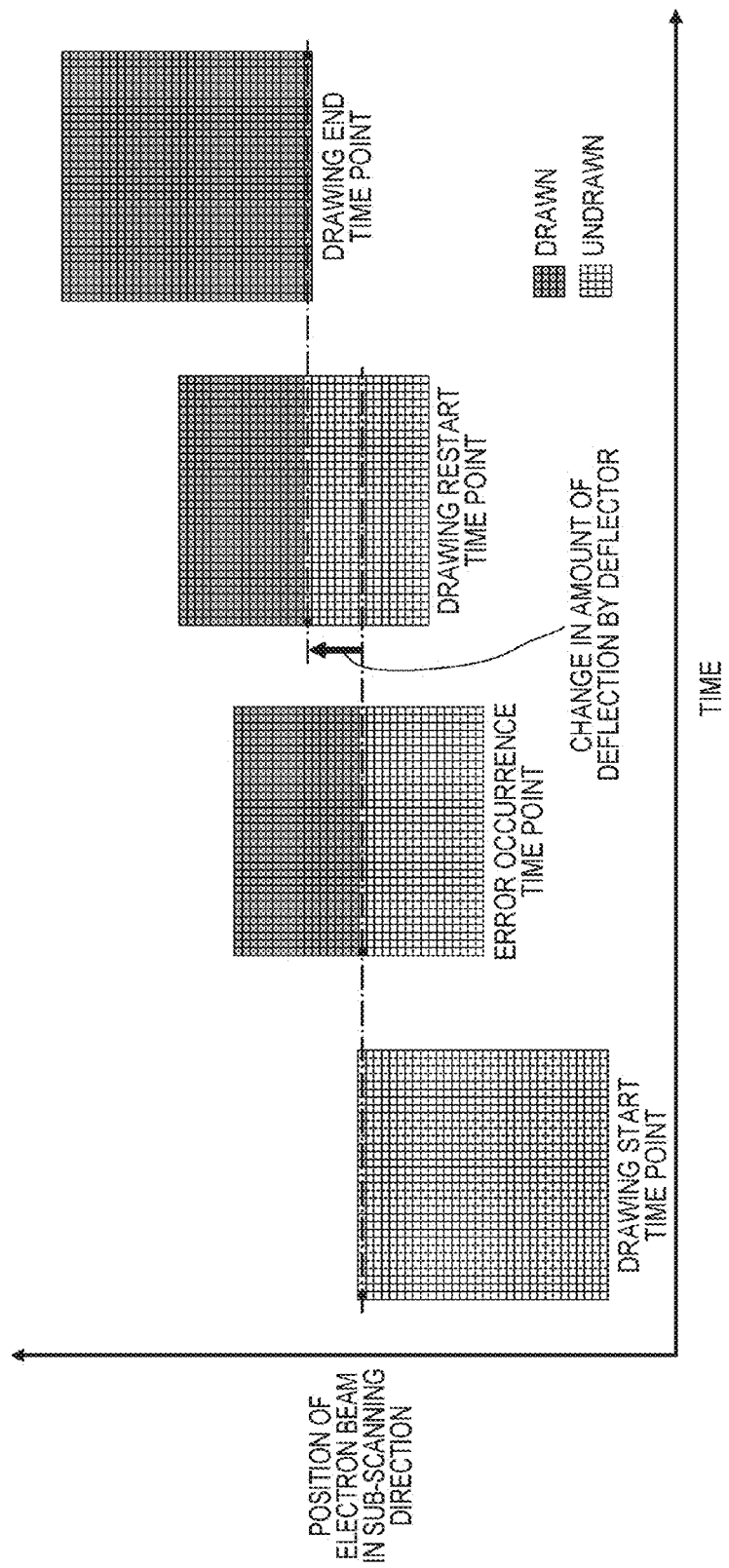
FIG. 6 is a view illustrating the amount of deflection of an electron beam in the sub-scanning direction by a deflector, and the position to which a substrate is driven in the sub-deflection direction by a stage mechanism, when an error occurs in the first embodiment.

FIG. 6 illustrates the positional relationship in the sub-scanning direction at the time of restart of drawing. In the duration from the drawing restart time point to the error occurrence time point (drawing stop time point), the maximum value of the amount of deflection of the electron beam in the sub-scanning direction is equal to the distance by which the substrate 8 moves in the sub-scanning direction during main-scanning on one row. At the drawing restart time point after an underrun error occurs and drawing is stopped, the amount of deflection of the electron beam in the sub-scanning direction is corrected by the amount of driving of the substrate 8, which is calculated in step S5, and drawing continues at the corrected position in the sub-scanning direction. When an underrun error occurs again after the restart of drawing, the position of deflection of the electron beam in the sub-scanning direction is corrected again. Therefore, at the end of drawing, the amount of correction of the amount of deflection in the sub-scanning direction is accumulated by an amount of correction corresponding to the amount of deflection in the sub-scanning direction per number of times of occurrence of an error in the past. Therefore, the Y deflector 15 must have a deflection width at which the amount of deflection in the sub-scanning direction can sufficiently be corrected with respect to the assumed number of times of occurrence of an error. Especially in drawing for each column shown in FIG. 4A, one column is continuously drawn, so the Y deflector 15 must have a deflection width at which the amount of deflection can be corrected in correspondence with the number of times of occurrence of an error during drawing on one column. On the other hand, referring to FIG. 4B, the drawing start position can be reset for each chip, so the Y deflector 15 need only have a deflection width corresponding to one chip.

Conventionally, drawing is restarted after returning the substrate 8 to the position at the error occurrence time point. Movement and settlement of the substrate 8 require, for example, about several hundred milliseconds to several seconds, thus lowering the throughput. The delay time until the restart of drawing becomes possible after drawing data is retransmitted can be kept as short as, for example, 1 ms or less because this delay time results from delay due to factors associated with an electrical/software process. This delay time is overwhelmingly shorter than a mechanical process time required to drive the substrate 8 by the stage mechanism 9. In this embodiment, the stage mechanism 9 drives the substrate 8 at a constant speed even during the stop of drawing, so the stage mechanism 9 does not change its operation state at all. This obviates the need to wait until the substrate 8 is moved or settled by the stage mechanism 9, so the throughput lowers only a little. Also, there is no need to prepare a mass buffer memory in preparation for an error, thus making it possible to easily mount a memory in the vicinity of a blanker and reduce the cost.

FIG. 7 illustrates the relationship between the deflection position and substrate position in the sub-scanning direction according to the second embodiment of the present invention. The second embodiment is different from the first embodiment in that in the former the speed of scanning of a substrate 8 in the sub-scanning direction by a stage mechanism 9 is set lower after the restart of drawing than before its stop.

Figure 5:
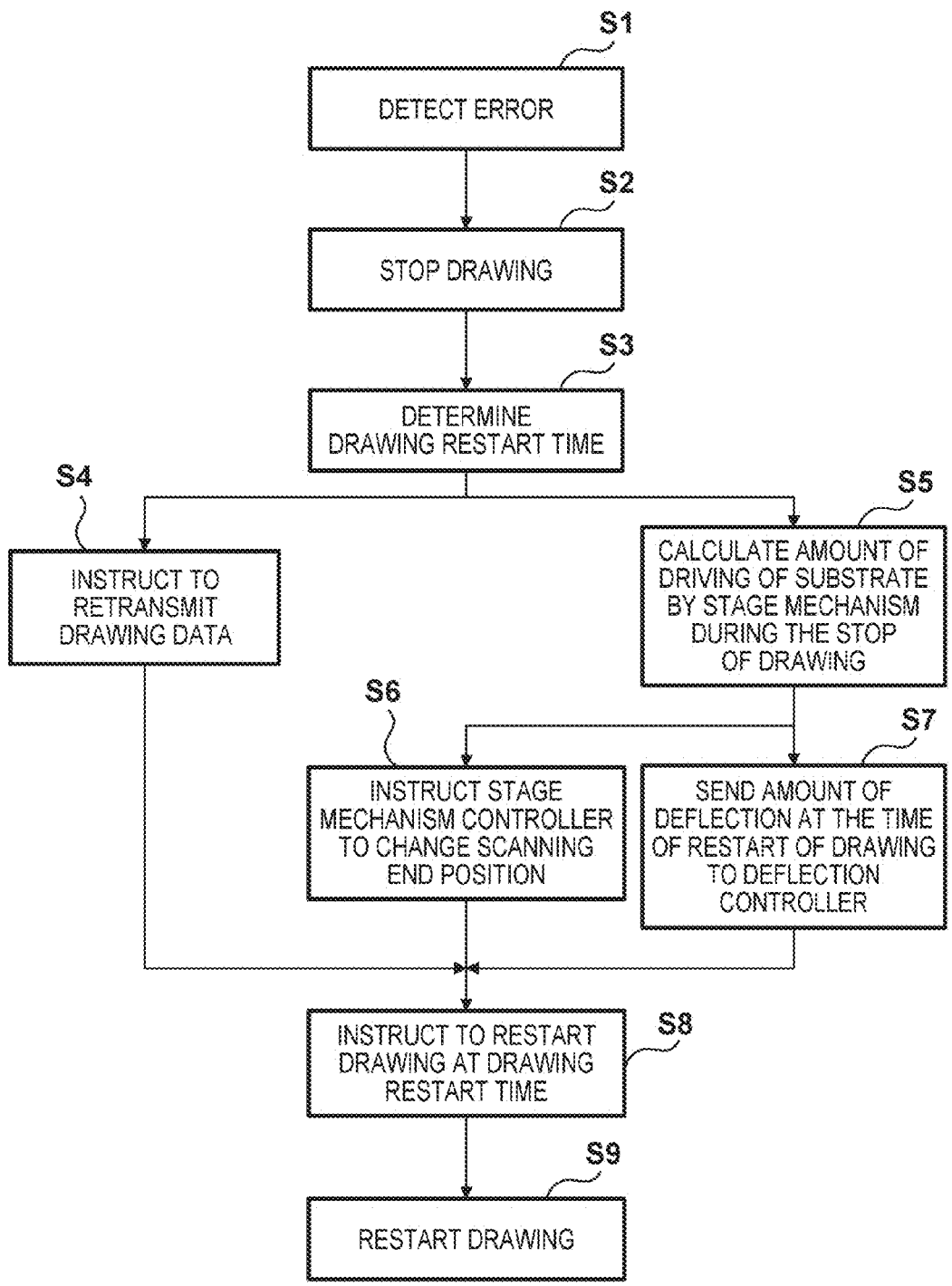
FIG. 5 is a flowchart for explaining an exemplary procedure of the operation of the charged-particle beam exposure apparatus when the occurrence of an error is detected.

In step S6 of the operation procedure shown in FIG. 5, a recovery controller 4 sets the speed of scanning of the substrate 8 in the sub-scanning direction by the stage mechanism 9 to be lower after the restart of drawing than before its stop. Note that the amount of drop in scanning speed can be determined to fall within the range in which a fluctuation in vibration/orientation of the stage mechanism 9 due to a drop in scanning speed settles/stabilizes to the degree that its adverse effect on the restart of drawing becomes as small as possible until the drawing restart time. The scanning speed is sufficiently dropped as long as this drop adversely affects the restart of drawing, to gradually return the amount of deflection of the electron beam in the sub-scanning direction to the initial state until the end of drawing so that the amount of change in scanning end position of the substrate 8 can become small or zero, as illustrated in FIG. 7. Also, the scanning speed of the substrate 8 may be maintained without slowdown when the number of times of occurrence of an error is small, and may be dropped when the number of times of occurrence of an error increases to the degree that the amount of correction of the deflection position in the sub-scanning direction exceeds a specific amount. While the speed of scanning of the substrate 8 by the stage mechanism 9 drops, the amount of deflection of the electron beam in the sub-scanning direction gradually changes, so a Y deflector controller 151 controls the amount of deflection of a Y deflector 15 so as to draw a pattern at an appropriate position by the electron beam in accordance with the scanning speed.

As described above, according to the second embodiment, the amount of change in electron beam in the sub-scanning direction can be kept small even when errors occur a plurality of times. Especially in drawing for each column shown in FIG. 4A, the scanning distance is long, and the number of times of occurrence of an error is large, so a great effect of suppressing the amount of correction of deflection in the sub-scanning direction can be produced.

Also, since the amount of correction of the amount of deflection of the electron beam in the sub-scanning direction can be set small, the deflection width of the Y deflector 15 can be designed to be small, thus making it possible to increase the level of freedom of design of the deflector. Hence, a more compact, accurate deflector can also be used. On the other hand, when the deflection width of the Y deflector 15 is kept large, the situation in which errors occur a large number of times can be coped with, thus making it possible to increase the tolerance of a transmission error of drawing data. This also makes it possible to simplify a measure against noise produced by the interface 2 to reduce the cost.

FIG. 8 illustrates the relationship between the deflection position and substrate position in the sub-scanning direction according to the third embodiment of the present invention. The third embodiment is different from the first and second embodiments in that in the former the drawing speed of the electron beam is set higher after the restart of drawing than before the stop of drawing.

In step S7, a recovery controller 4 instructs a Y deflector controller 151 to correct the amount of deflection in the sub-scanning direction up to the drawing position at the drawing restart time, and instructs a blanker controller 131 to raise the drawing speed. The amount of rise in drawing speed corresponds to the amount of drop in speed of scanning of the substrate 8 by the stage mechanism 9 in the second embodiment. In the third embodiment as well, the amount of deflection of the electron beam in the sub-scanning direction is gradually returned to the initial state until the end of drawing so that the amount of change in electron beam in the sub-scanning direction can become small or zero. To raise the drawing speed, the recovery controller 4 instructs an X deflector controller 141 and the Y deflector controller 151 to raise the deflection speed. Also, because the drawing time per unit region is shortened, the recovery controller 4 sends an instruction to an electron gun 11 to increase the intensity of the electron beam, and sends an instruction to a drawing data source 1 to increase the transmission rate of drawing data. The third embodiment may be practiced together with the second embodiment.

A method of manufacturing an article according to a preferred embodiment of the present invention is suitable for manufacturing an article such as a semiconductor device or an original (also called, for example, a reticle or a mask). The manufacturing method can include a step of drawing a pattern on a substrate, coated with a photosensitive agent, using the above-mentioned charged-particle beam exposure apparatus, and a step of developing the substrate having the pattern drawn on it. When a device is to be manufactured, the manufacturing method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-259523, filed Nov. 19, 2010, which is hereby incorporated by reference herein in its entirety.

What is claimed is:

1. A charged-particle beam exposure apparatus which includes a deflector that deflects a charged-particle beam, and a stage mechanism that drives a substrate, and draws a pattern on the substrate while scanning the charged-particle beam in a main-scanning direction by the deflector and scanning the substrate in a sub-scanning direction by the stage mechanism, the apparatus comprising:

a blanker unit configured to control irradiation and unirradiation of the substrate with the charged-particle beam; and a controller configured to control the deflector to deflect the charged-particle beam in the sub-scanning direction by an amount of driving of the substrate in the sub-scanning direction by the stage mechanism during a period of time from stop of drawing on the substrate until restart thereof when the drawing on the substrate is stopped and then restarted while the substrate is driven in the sub-scanning direction by the stage mechanism.

2. The apparatus according to claim 1, further comprising:

a blanker controller configured to control the blanker unit in accordance with drawing data; and a detector configured to detect that an underrun error which hampers supply of correct drawing data to the blanker controller has occurred while the drawing on the substrate is in progress, wherein the controller controls the blanker controller to stop the drawing as the occurrence of the underrun error is detected by the detector.

3. The apparatus according to claim 1, wherein the controller changes an end position of scanning of the substrate in the sub-scanning direction by the stage mechanism by the amount of driving of the substrate in the sub-scanning direction by the stage mechanism during the period of time from the stop of drawing until the restart thereof.

4. The apparatus according to claim 1, wherein the controller sets a speed of scanning of the substrate by the stage mechanism to be lower after the restart thereof than before the stop of drawing.

5. The apparatus according to claim 1, wherein the controller sets a drawing speed higher after the restart of drawing than before the stop of drawing.

6. A method of manufacturing an article, comprising the steps of:

drawing a pattern on a substrate, coated with a photosensitive agent, using a charged-particle beam exposure apparatus which includes a deflector that deflects a charged-particle beam, and a stage mechanism that drives the substrate, and draws a pattern on the substrate while scanning the charged-particle beam in a main-scanning direction by the deflector and scanning the substrate in a sub-scanning direction by the stage mechanism; and developing the substrate having the pattern drawn thereon, wherein the apparatus comprises:

a blanker unit configured to control irradiation and unirradiation of the substrate with the charged-particle beam; and a controller configured to control the deflector to deflect the charged-particle beam in the sub-scanning direction by an amount of driving of the substrate in the sub-scanning direction by the stage mechanism during a period of time from stop of drawing on the substrate until restart thereof when the drawing on the substrate is stopped and then restarted while the substrate is driven in the sub-scanning direction by the stage mechanism.

* * * * *